US007283792B2

(12) United States Patent
Chmiel

(10) Patent No.: US 7,283,792 B2
(45) Date of Patent: Oct. 16, 2007

(54) METHOD AND APPARATUS FOR PROVIDING LIMITING POWER ADJUSTMENT IN A WIRELESS COMMUNICATION SYSTEM

(75) Inventor: Maciej Chmiel, Temecula, CA (US)

(73) Assignee: Nokia Corporation, Helsinki (FI)

( * ) Notice: Subject to any disclaimer, the term of this patent is extended or adjusted under 35 U.S.C. 154(b) by 361 days.

(21) Appl. No.: 10/966,207

(22) Filed: Oct. 15, 2004

(65) Prior Publication Data

US 2006/0084391 A1 Apr. 20, 2006

(51) Int. Cl.
*H04B 1/00* (2006.01)
*H04B 7/00* (2006.01)

(52) U.S. Cl. .............. 455/69; 455/67.11; 455/522; 455/103; 455/126; 455/127.1; 330/129; 330/149; 330/279

(58) Field of Classification Search .......... 455/69, 455/67.11, 522, 103, 126, 127.1
See application file for complete search history.

(56) References Cited

U.S. PATENT DOCUMENTS

| | | | | | |
|---|---|---|---|---|---|
| 5,216,696 | A | * | 6/1993 | Poklemba | 375/346 |
| 5,892,397 | A | * | 4/1999 | Belcher et al. | 330/149 |
| 5,991,618 | A | * | 11/1999 | Hall | 455/425 |
| 6,018,650 | A | * | 1/2000 | Petsko et al. | 455/234.1 |
| 6,055,418 | A | * | 4/2000 | Harris et al. | 455/91 |
| 6,072,784 | A | * | 6/2000 | Agrawal et al. | 370/311 |
| 6,084,904 | A | * | 7/2000 | Wang et al. | 375/130 |
| 6,272,354 | B1 | * | 8/2001 | Saario | 455/522 |
| 6,760,598 | B1 | * | 7/2004 | Kurjenniemi | 455/522 |
| 6,781,966 | B1 | * | 8/2004 | Kim | 370/311 |
| 6,785,247 | B1 | * | 8/2004 | Lee | 370/311 |
| 6,963,553 | B1 | * | 11/2005 | Cordier et al. | 370/342 |
| 7,145,396 | B2 | * | 12/2006 | Dupuis | 330/298 |

FOREIGN PATENT DOCUMENTS

| | | |
|---|---|---|
| EP | 1569330 A1 | 8/2005 |
| WO | WO96/33555 A1 | 10/1996 |
| WO | WO 96/33555 A1 | 10/1996 |

OTHER PUBLICATIONS

PCT/IB2005/003059, International Search Report, Mar. 16, 2006.
IB, PCT/IB2005/003059, International Search Report, Mar. 16, 2006.

* cited by examiner

*Primary Examiner*—Marceau Milord
(74) *Attorney, Agent, or Firm*—Ditthavong Mori & Steiner, P.C.

(57) ABSTRACT

An approach provides for limiting power adjustment in a wireless system (e.g., cellular network) to extend, for example, talk time. Parameter values specifying operating conditions of the wireless terminal are collected for power adjustment of a radio frequency (RF) amplifier within the wireless terminal. A power adjustment factor is computed based on the parameter values, wherein the power adjustment factor is used adjust limiting power of the RF amplifier.

34 Claims, 9 Drawing Sheets

METHOD AND APPARATUS FOR PROVIDING LIMITING POWER ADJUSTMENT IN A WIRELESS COMMUNICATION SYSTEM

FIELD OF THE INVENTION

The present invention relates to communications, and more particularly, to providing efficient transmission in a radio frequency (RF) system.

BACKGROUND OF THE INVENTION

Radio communication systems, such as cellular systems, provide users with the convenience of mobility. This convenience has spawned significant adoption by consumers as an accepted mode of communication for business and personal uses. Cellular service providers, for example, have fueled this acceptance by developing more enhanced network services and applications. Consequently, manufacturers of mobile devices (e.g., cellular phones) are challenged to continually add greater and greater functional capabilities in smaller and smaller form factors. For instance, beyond the already advanced telephony and data capabilities, these devices can include other sophisticated functions and applications, such as digital camera functionality and gaming applications. The goals of greater functionalities with reduced form factor are at odds with the design of the power system of the mobile devices, in that generally more functions require more battery consumption. However, consumers expect more capability as well as identical, or even longer, operation of the phones, thereby providing longer talk-time, etc. Therefore, to be competitive, the manufacturers need to address the ever growing requirement for longer battery life.

Traditionally, advancements in battery life have concentrated on the battery manufacturers. Unfortunately, significant progress in battery technology requires breakthroughs in chemical and material science. These advancements in chemical and material science lag significantly behind the progress characteristic of the mobile communications industry. That is, the development cycle of battery technology cannot keep pace with the development cycle of mobile phone technology.

Alternatively, cellular phone manufacturers rely on development in hardware that consumes less power. However, purchasing new equipment to extend battery life is an expensive proposition for most consumers.

Therefore, there is a need for an approach to enhance transmission efficiency, which can yield improved battery life. There is also a need to extend battery life without costly hardware modifications or upgrades.

SUMMARY OF THE INVENTION

These and other needs are addressed by the present invention, in which an approach provides a multidimensional Algorithmic Power Adjustment (APA) mechanism for controlling the limiting power of a wireless terminal (e.g., a cellular handset) for a given operating condition. It is recognized that traditionally in radio systems, such as Code Division Multiple Access (CDMA) cellular systems, the RF power amplifiers are required to provide constant limiting power output over all operating conditions (e.g., channel frequency, ambient temperature, battery voltage and channel configuration). The limiting power is usually set to the maximum power that a phone can output while meeting linearity and Specific Absorption Rate (SAR) requirements posed by standards. From a field performance perspective, the desired characteristic is maximization of the conducted output power, which in turn maximizes the Effective Radiated Power (ERP) of the antenna and extends range of the cellular communication. However, it is recognized that linear performance of the RF power amplifiers degrades at extreme conditions, such as elevated temperatures, low supply voltages, and operation at extreme corners of the frequency bands. Under these operating conditions, traditionally, handsets are still required to provide constant limiting power—under such scenarios, RF engineers are challenged to produce an amplifier design that can meet Standards Emission Requirements. The APA, according to one embodiment of the present invention, provides a wireless handset with a system wide capability to target specific regions of the handset's operating conditions for output power control, and in turn linearity optimization, thereby allowing transmitter (TX) systems to accept power amplifiers that are designed more aggressively for low current consumption. According to one embodiment of the present invention, this mechanism is effected via the Transmitter's Automatic Gain Control (AGC) algorithm as implemented by a Digital Signal Processor (DSP). The APA mechanism factors in the following parameters associated with the operation of the wireless terminal: transmit frequency, battery voltage, temperature and radio channel configuration. The above arrangement advantageously accounts for the wireless terminal's operating conditions for output power control and in turn linearity optimization, which leads to overall current reduction, and therefore talk time improvement.

According to one aspect of the present invention, a method for controlling transmission power in a wireless terminal is disclosed. The method includes determining a plurality of parameter values for power adjustment of a radio frequency (RF) amplifier within the wireless terminal, the parameter values specifying operating conditions of the wireless terminal. The method includes computing a power adjustment factor based on the parameter values, wherein the power adjustment factor is used to adjust limiting power of the RF amplifier.

According to another aspect of the present invention, an apparatus for controlling transmission power in a wireless terminal is disclosed. The apparatus includes logic configured to determine a plurality of parameter values for power adjustment of a radio frequency (RF) amplifier within the wireless terminal. The parameter values specify operating conditions of the wireless terminal. The logic is further configured to compute a power adjustment factor based on the parameter values, wherein the power adjustment factor is used to adjust limiting power of the RF amplifier.

According to another aspect of the present invention, an apparatus for communicating in a radio communication system is disclosed. The apparatus includes a radio frequency (RF) amplifier configured to amplify a signal for transmission over the radio communication system. The apparatus additionally includes logic configured to determine a plurality of parameter values for power adjustment of the RF amplifier. The parameter values specify operating conditions. The logic is further configured to compute a power adjustment factor based on the parameter values, wherein the power adjustment factor is used to adjust input power of the RF amplifier.

According to another aspect of the present invention, an apparatus for controlling transmission power is disclosed. The apparatus includes means for determining a plurality of parameter values for power adjustment of a radio frequency (RF) amplifier within a wireless terminal, the parameter values specifying operating conditions of the wireless terminal. Also, the apparatus includes means for computing a power adjustment factor based on the parameter values, wherein the power adjustment factor is used to adjust limiting power of the RF amplifier.

According to another aspect of the present invention, a method for adjusting power of a transmitter power amplifier in a wireless terminal is disclosed. The method includes collecting sensor information on operating conditions of the wireless terminal. The method also includes determining, based on the collected sensor information and stored parameter values, an adjustment factor for modifying a tuned power of a radio frequency (RF) amplifier within the wireless terminal. The adjustment factor modifies limiting power of the transmitter power amplifier for the operating conditions. Further, the method includes generating output power by applying the determined adjustment factor to the tuned power.

According to yet another aspect of the present invention, an apparatus for operating in a wireless network is disclosed. The apparatus includes means for collecting sensor information on operating conditions. Additionally, the apparatus includes means for determining, based on the collected sensor information and stored parameter values, an adjustment factor for modifying a tuned power of a radio frequency (RF) amplifier. The adjustment factor modifies limiting power of the RF amplifier for the operating conditions. Further, the apparatus includes means for generating output power by applying the determined adjustment factor to the tuned power.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

An apparatus, method, and software for controlling transmission power in a wireless terminal are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1A:
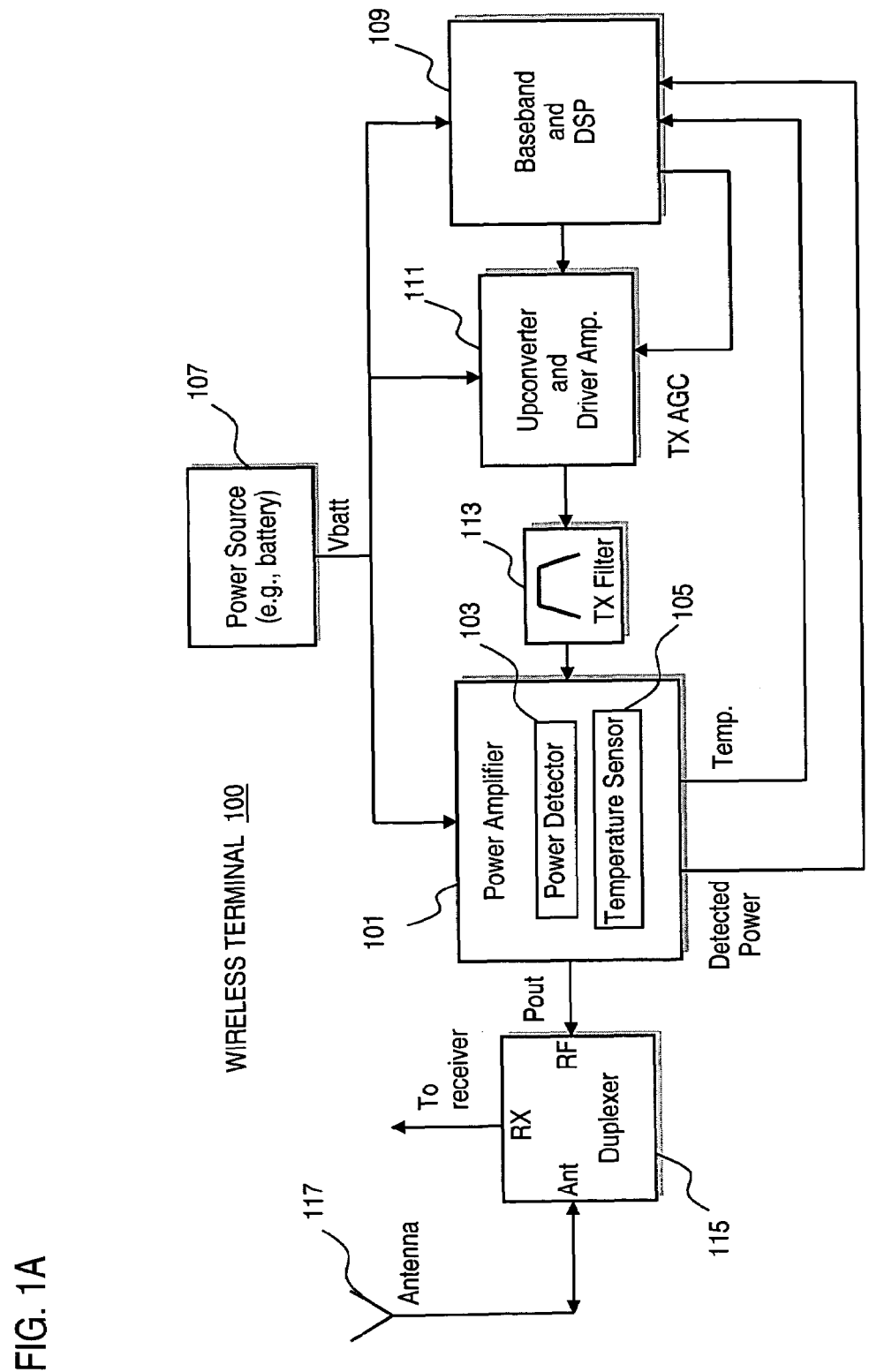
FIGS. 1A and 1B are, respectively, a diagram of a wireless terminal configured to perform power adjustments and a diagram showing variable placement of a power detector within the transmitter chain of the wireless terminal, according to embodiments of the present invention.

FIG. 1A is a diagram of a wireless terminal configured to perform power adjustments, according to an embodiment of the present invention. A wireless terminal 100 can operate in various radio communication systems, such as a cellular system of FIG. 2. By way of example, the wireless terminal 100 can be deployed as a cellular handset (or phone), a cordless phone, a mobile transmitter, a stationary wireless transmitter, a wireless personal digital assistant (PDA), a wireless modem, or a pager. The wireless terminal 100 employs an algorithmic approach to provide efficient transmission by minimizing power consumption by recognizing, in part, that the linear performance requirement of a power amplifier can deteriorate, for example, under extreme operating conditions such as elevated temperatures, low supply voltages and high corners of operating frequency bands. For the purposes of explanation, the present invention is described with respect to a cellular handset, operating in a cellular network as shown in FIG. 2.

Figure 2:
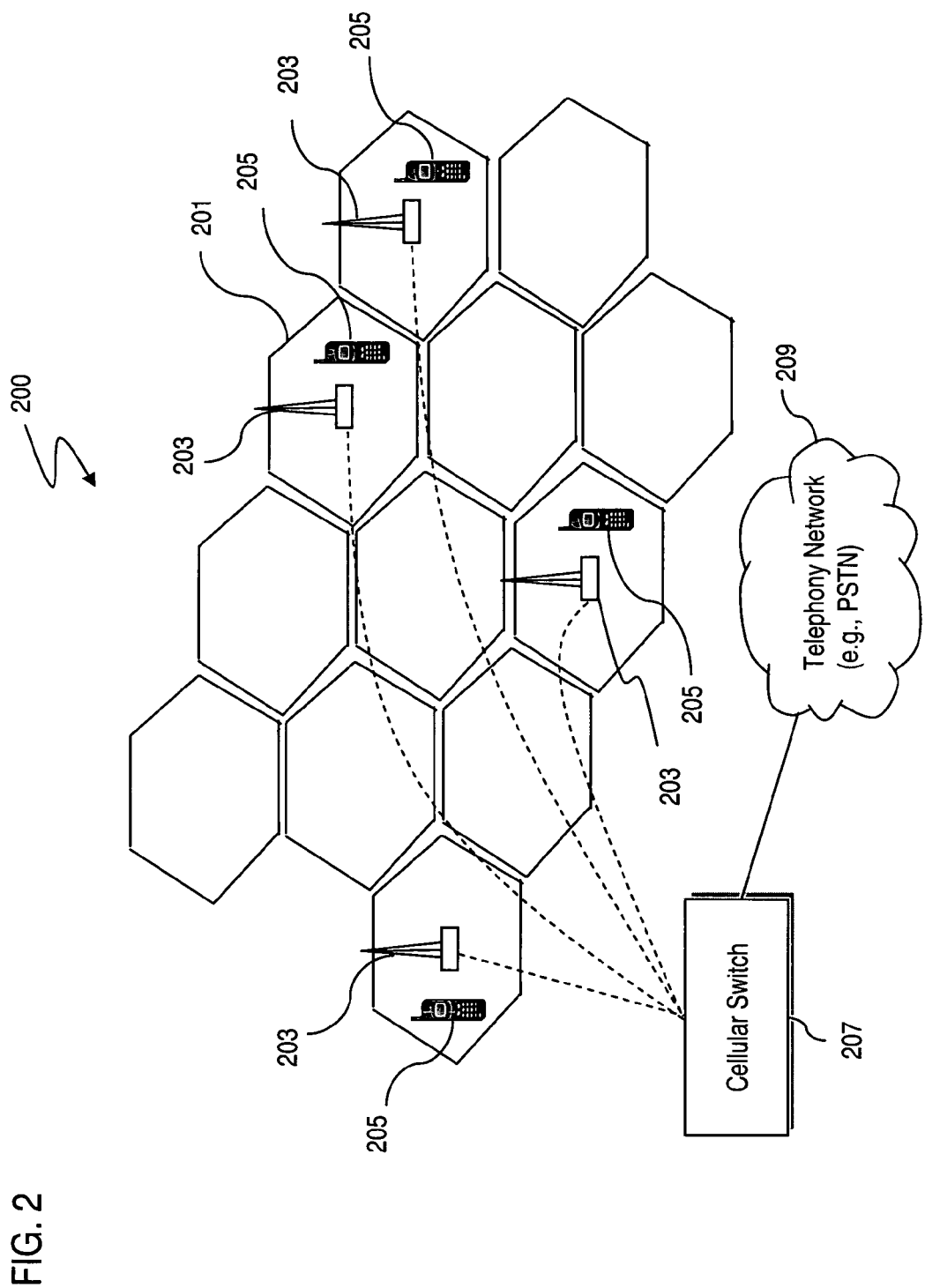
FIG. 2 is a diagram a cellular system capable of supporting the wireless terminal of FIG. 1A.

FIG. 2 is a diagram a cellular system capable of supporting the wireless terminal of FIG. 1A. A cellular system 200 can be conceptually viewed as comprising cells 201 constituting a hexagonal frequency pattern. The cellular system 200 can be an analog system or a digital system, employing any number of standards and technologies, such as Code Division Multiple Access (CDMA), Wideband CDMA (WCDMA), Time Division Multiple Access (TDMA), Global System for Mobile Communications (GSM), and etc. Typically, one base station 203 defines one cell 201, which, in actual systems, can vary in size depending on the terrain and capacity demands. The base stations 203 communicate with cellular phones 205 and process calls in conjunction with a cellular switch 207. The cellular switch 207 is responsible for handoffs between the base stations 203 as a cellular phone 205 crosses the cells. The cellular switch 207 also provides connectivity to other telephony networks 209, such as the Public Switched Telephone Network (PSTN). It is noted that the transmission characteristics vary depending, among other factors, on proximity to the base station 203.

Returning to the wireless terminal 100 of FIG. 1A, a key component of the transmitter chain is a power amplifier 101, which, in an exemplary embodiment, includes a power detector 103 and a temperature sensor 105. Although the power detector 103 and the temperature sensor 105 are shown as being a part of the power amplifier 101, it is recognized that such components 103, 105 can be distinct and separate from the power amplifier 101. The power amplifier 101 receives power from a power source 107, which can be a battery.

A baseband and Digital Signal Processor (DSP) block 109 effects a transmitter Automatic Gain Control (AGC) scheme with an upconverter and driver amplifier circuit 111. The baseband and Digital Signal Processor (DSP) block 109 includes a digital-to-analog (D/A) converter (not shown). The upconverter and driver amplifier circuit 111 outputs a transmission signal that has been upconverted to a transmitter (TX) filter 113. The TX filter 113 shapes the upconverted signal to reduce noise and eliminate unwanted frequencies. The filtered signal is then amplified by the power amplifier 101. A duplexer 115 receives the amplified signal and radiates the energy over an antenna 117. The duplexer 115 allows simultaneous reception and transmission of RF signals over antenna 117.

Figure 3:
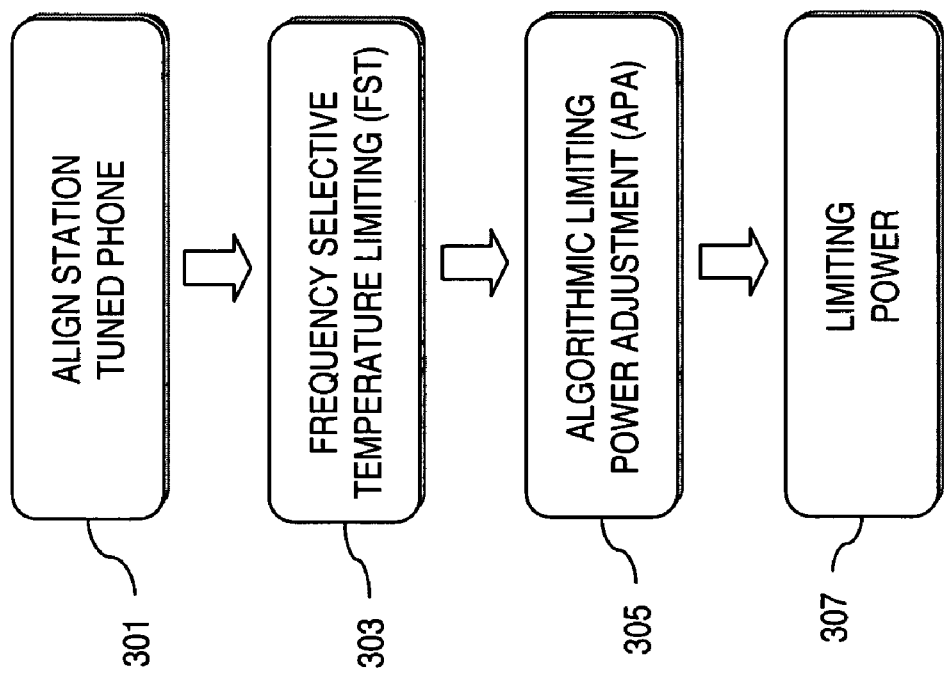
FIG. 3 is a diagram of the functional layers of the algorithmic limiting power adjustment, according to an embodiment of the present invention.

FIG. 3 is a diagram of the functional layers of the algorithmic limiting power adjustment, according to an embodiment of the present invention. As mentioned, traditionally, RF power amplifiers used in cellular applications generate maximum power output to meet Telecommunications Industry Association (TIA) IS-98 linearity and Specific Absorption Rate (SAR) requirements. For instance, the SAR requirement can specify a value that corresponds to the relative amount of RF energy that can be safely absorbed in the head of a user of a wireless handset.

As noted, typically, maximization of transmitter output power is desired, which in turn maximizes an antenna's effective radiated power (ERP), thereby extending communication range. This maximum power, called the "limiting power," is traditionally held constant irrespective of the operating conditions. However, it is recognized that power amplifier performance is affected by a variety of factors, such as ambient temperature, low supply voltages and high corners of operating frequency bands. By contrast, the wireless terminal 100 of FIG. 1A provides for linearity optimization by accounting for the various operating conditions through an algorithmic limiting power adjustment (APA) mechanism. This functionality can be viewed as comprising the following software layers: an Align Station Tuned Phone layer 301, a Frequency Selective Temperature limiting (FST) layer 303, an APA layer 305, and a Limiting Power layer 307.

The role of the FST layer 303 is to apply linear correction to the post power adjustment (PA) loss over temperature and uncompensated limiting power. The FST layer 303 flattens temperature limiting response to provide a baseline for the APA layer 305. The FST layer 303 rests above the APA layer 305 because of the fact that post-PA (power adjustment) losses tend to change with varying temperatures, and this change will not be corrected by hardware, such as the power detector 103. The correction cannot be performed by the power detector 103 largely because power detection is performed at the junction between the PA and post-PA stages; the post PA losses can occur stemming from changes in temperature and transmit conditions.

Figure 1B:
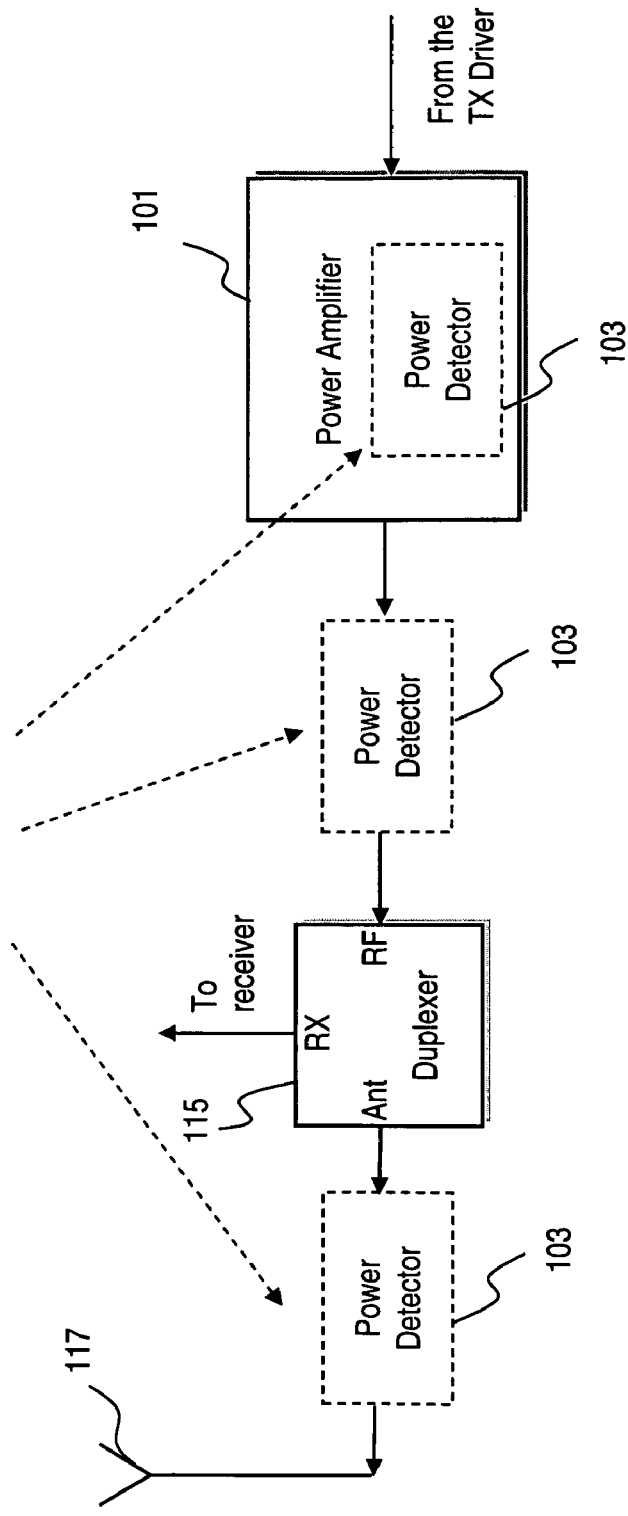

As seen in FIG. 1B, power detection can be implemented at various locations with the TX chain of the wireless terminal 100. The detector 103 can be situated between the power amplifier 101 and the duplexer 115. Alternatively, the detector 103 can reside at the antenna 117; i.e., after the duplexer 115. Depending on the placement of this detector 103, the FST process need not be performed. For example, if the detector 103 is placed at the antenna 117, then the FST layer 303 is not involved.

The FST limiting layer 303 provides a software correction layer to configure temperature behavior of the post RF power amplifier components. This layer 303 provides initial limiting power temperature correction and offers a baseline for APA operation. When deriving APA layer 305, it is assumed that the limiting power in the transmitter (TX) system remains constant (at its tuned value) over all conditions including transmit conditions and temperature. Since APA is relative to the current limiting power, if the outside parameters fluctuate over operating (transmit) conditions, and especially temperature, these changes would appear as an error in the output power.

The multidimensional APA layer 305 controls the limiting power for a given operating condition to satisfy predetermined requirements (e.g., IS-98 linearity and SAR requirements). The APA layer 305 can operate under different channel configurations (e.g., IS-95, IS2KRC3, or IS2KDCCH modes). For instance, it has been observed that in IS2K modes with channel configurations resulting in a peak-to-average power ratio (PAR) higher than 3.85 (IS-95), this algorithm allows for efficient use of linearity margins. The margins that are achieved can be attributed to the fact that RF power amplifiers are inherently over-designed to generate maximum power at nominal conditions to satisfy linearity requirements at extreme operating conditions. For example, if APA is used in a system in which the power amplifier is designed to operate with IS-95PAR (3.85), the same amount of power can be output in IS2K RC3 with a PAR of 4.5 (and meet ACPR specification) throughout most of the operating conditions.

Figure 4:
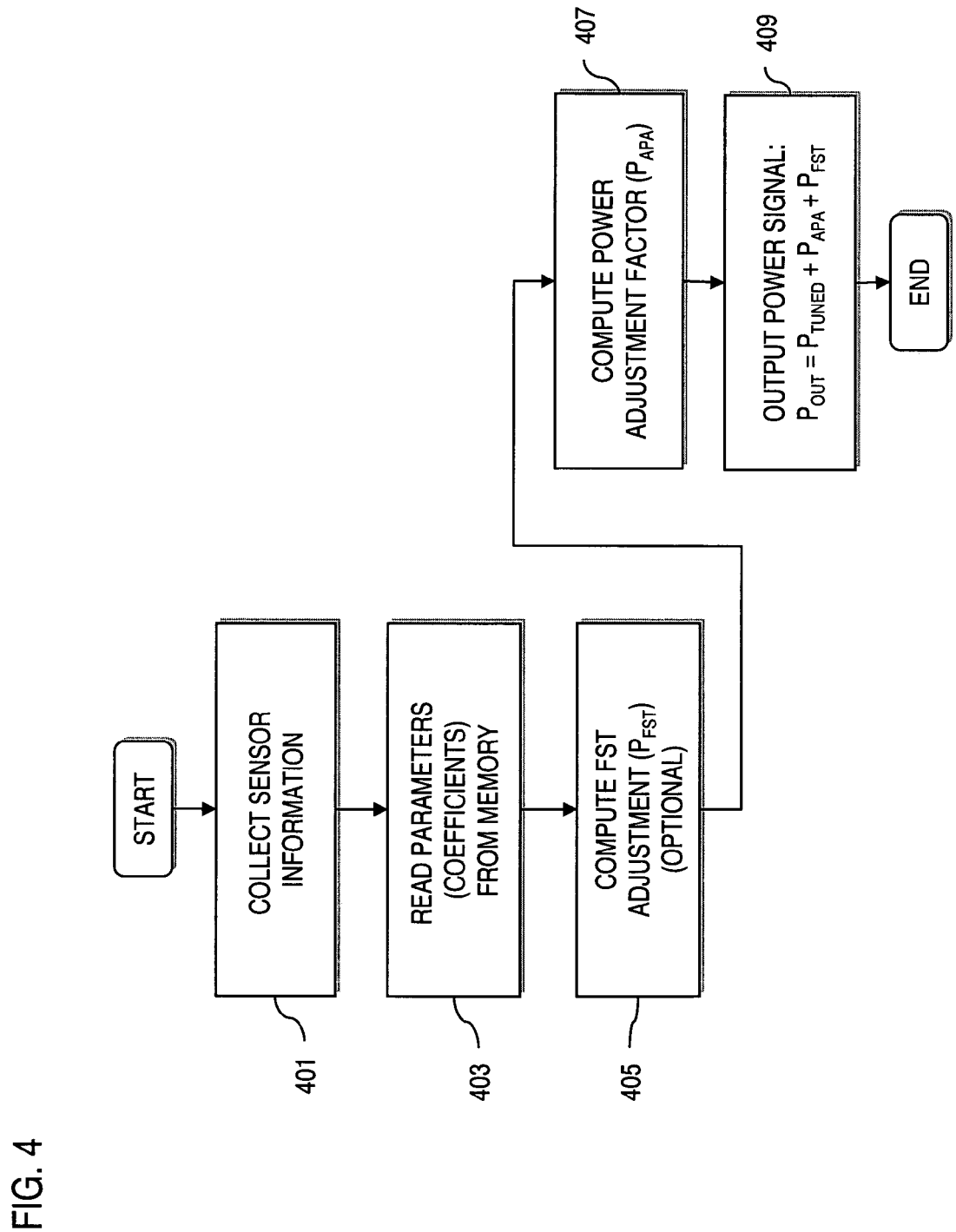
FIG. 4 is a flowchart of a process for providing power adjustment, according to an embodiment of the present invention.

FIG. 4 is a flowchart of a process for providing power adjustment, according to an embodiment of the present invention. In step 401, sensor information is collected, for example from the temperature sensor 105, to provide initial limiting temperature correction as well as a baseline for APA operation. Next, parameters (coefficients) are retrieved, as in step 403, from a non-volatile data space, such as memory (not shown) within the wireless terminal 100. At this point, the FST adjustment can optionally be computed to account for variance in the ambient temperature, per step 405.

In step 407, a power adjustment factor ($P_{APA}$) is computed, taking into account the temperature of the wireless terminal 100, battery voltage, and transmit frequency.

$$P_{APA(dB)} = A_n * \text{Freq}^n + A_{n-1} * \text{Freq}^{n-1} + \ldots + A * \text{Freq} + B_n * V_{batt}^n + B_{n-1} * V_{batt}^{n-1} + \ldots + B * V_{batt} + C_n * T^n + C_{n-1} * T^{n-1} + \ldots + C * T + \text{Channel} * D + E \qquad \text{Eq. (1)}$$

In the above equation, Freq represents the given TX frequency (Hz), $V_{batt}$ is the given battery voltage (V), T is the internal temperature (° C.) of the wireless terminal 100, and Channel is the radio channel configuration. The coefficients, $A_n \ldots A$, $B_n \ldots B$, $C_n \ldots C$, and D, provide weighting values to allow for adaptation to known system conditions. E is a constant that can be used to refine the power adjustment factor. Also, in an exemplary embodiment, n is an integer.

According to one embodiment of the present invention, factors A, B, C and D are derived from empirical characterization of the TX chain performance.

Next, the power adjustment factor, $P_{APA}$, is combined with a given limiting power target on the tuned wireless terminal 100 ($P_{TUNED}$), as in step 409. Thereafter, the final output power ($P_{OUT}$) is generated by summing $P_{APA}$, $P_{TUNED}$, and $P_{FST}$ (frequency selective temperature limiting correction):

$$P_{OUT} = P_{TUNED} + P_{APA} + P_{FST}, \qquad \text{Eq. (2)}$$

wherein $P_{TUNED}$ is the limiting power target as obtained on the tune station, the $P_{APA}$ is the power adjustment resulting from applying APA, and $P_{FST}$ represents the power adjustment factor resulting from optionally applying frequency selective temperature limiting equations for linearly correcting for temperature drifts (i.e., changes).

The measure of amplifier linearity is in terms of Adjacent Channel Power Ratios (ACPRs): ACPR1—first adjacent power ratio and ACPR2—adjacent channel power ratio. At conditions where ACPR fails specification, especially with elevated ambient temperatures and low supply voltages, the output power, $P_{OUT}$, is adjusted downward until ACPR specification is met.

Figure 5:
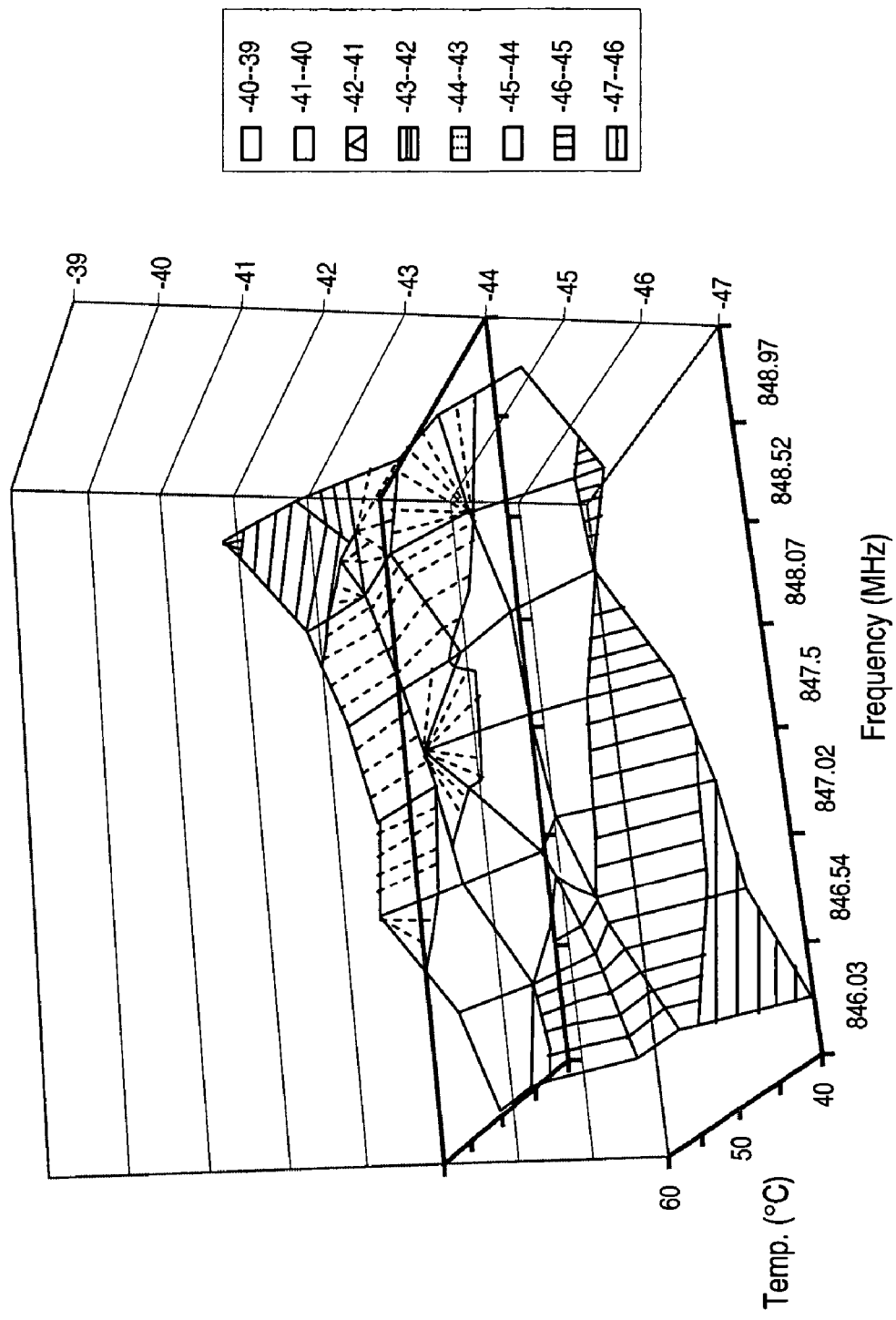
FIG. 5 is a graph showing exemplary adjacent power ratios (ACPRs) of the wireless terminal of FIG. 1A captured at constant limiting power.
Figure 6:
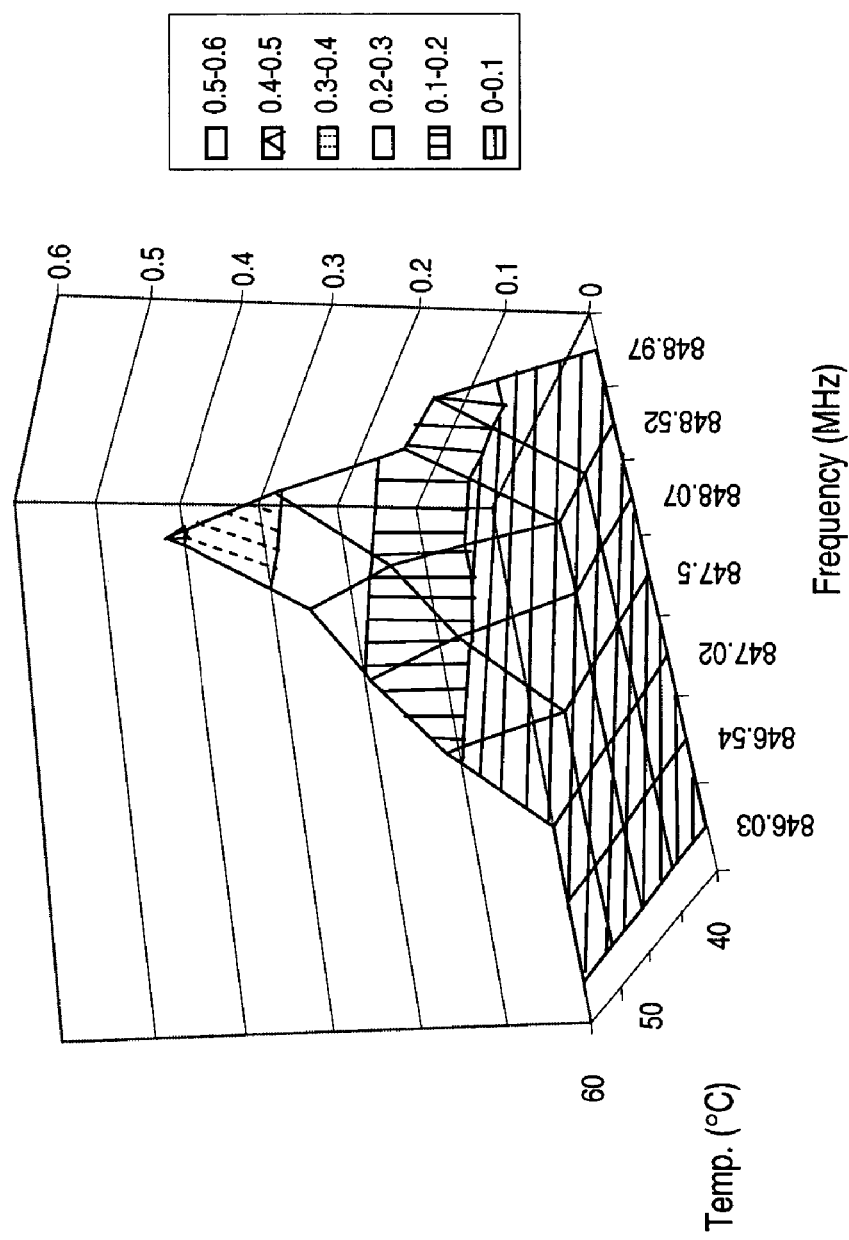
FIG. 6 is a graph showing the measured back-off of the power amplifier of FIG. 1A.
Figure 7:
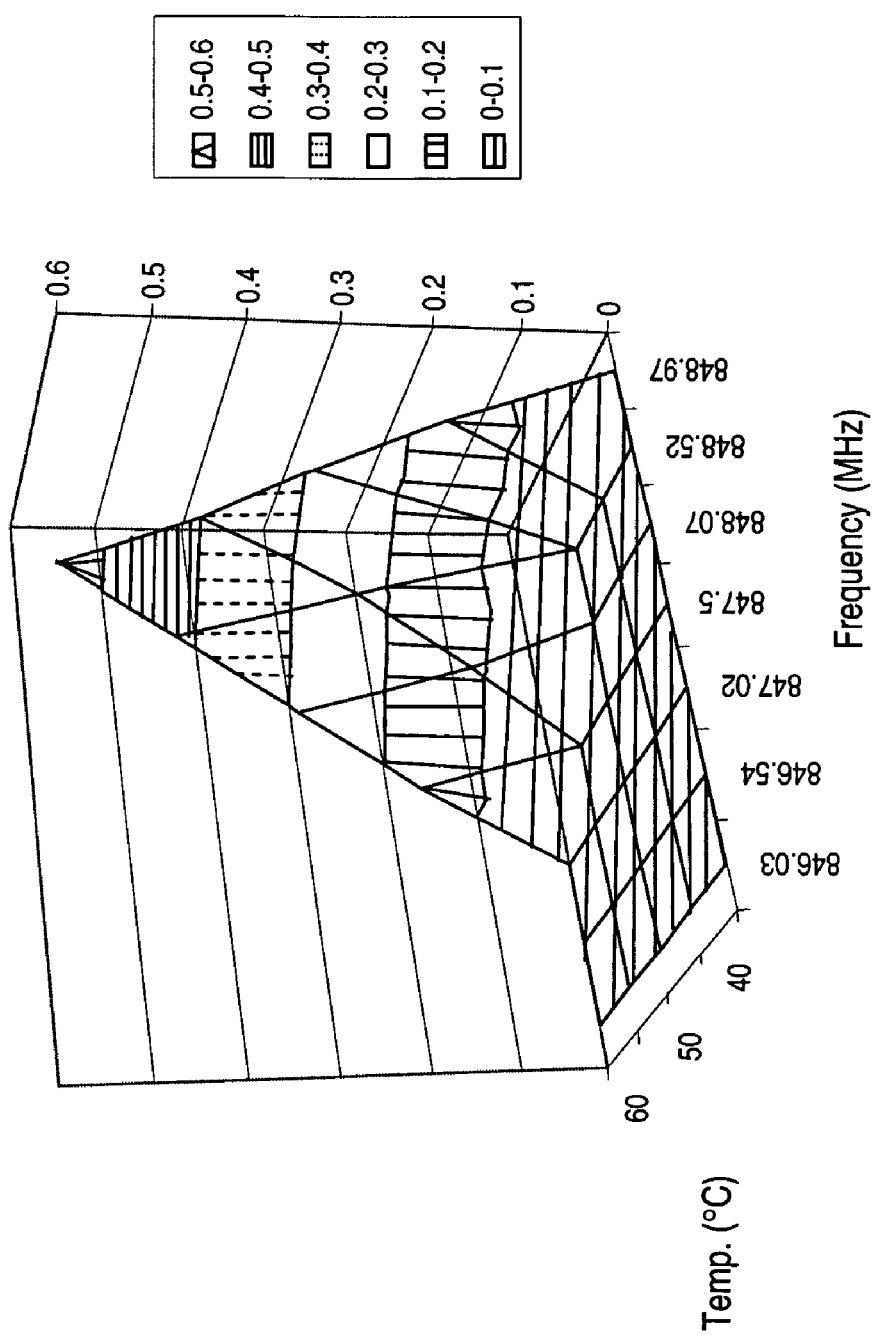
FIG. 7 is a graph showing the algorithmic back-off of the power amplifier of FIG. 1A.

FIGS. 5-7 show an exemplary scenario for adjusting power $P_{OUT}$ for a cellular phone operating in a CDMA cellular network. FIG. 5 is a graph showing exemplary adjacent power ratios (ACPRs) of the wireless terminal of FIG. 1A captured at constant limiting power. In this example, an ACPR1 of −4 dBC serves as a target in an IS-95 channel configuration. The results illustrate that this particular phone fails the target specification of −44 dBC ACPR1 (−42 dBC (per IS-98)—2 dB margin) at battery voltages lower than 3.4V, frequencies above 846 MHz and temperatures above approximately 50° C. At all other conditions the ACPR1 requirements are met. FIG. 6 illustrates the amount of output power that needs to be lowered at the conditions in which ACPR1 fails in order to satisfy the ACPR1 target.

For this analysis, the set of 3-dimensional curves (FIGS. 5 and 6) are fitted into a single, multidimentional equation. In this particular example, the equation is linear, but it is contemplated that other behaviors can result, including nonlinear, or higher order. This is accomplished by fitting temperature, voltage and frequency trends into separate first order equations (or higher order in different cases) and combining them into a single shape equation, shown in Table 1:

TABLE 1

| Equation | Variable Definition |
| --- | --- |
| Voltage Equation: $-2.75 * V_{batt} + 9.335$ | $V_{batt}$: battery voltage |
| Frequency Equation: $0.276 * Freq - 233.8$ | Freq: transmit frequency |
| Temperature Equation: $0.0267 * T_{amb} - 1.0545$ | $T_{amb}$: ambient temperature |

Combining the above three equations (in Table 1) into a single algorithm, and tuning coefficient D to match measured data, yields the following adjustment equation (i.e., $P_{adjust} = P_{LIMIT} + P_{APA}$, where $P_{LIMIT} = P_{TUNED} + P_{FST}$):

$$P_{adjust} = -2.75 * V_{batt} + 0.276 * Freq + 0.0267 * T_{amb} - 226.5605 \quad \text{Eq. (3)}$$

Accordingly, the resulting APA algorithm and FST equations can be implemented as part of the DSP software, with all coefficients stored in a non-volatile device space. It is noted that negative values can be disregarded by the baseband and DSP block 109.

FIG. 7 is a graph showing the algorithmic back-off of a power amplifier, according to an embodiment of the present invention. Using this back-off scheme, the cellular phone can extend talk time by 10%-20% over the traditional approach vis-à-vis what the talk time would have been if the RF power amplifier 101 were redesigned to meet the linearity standards without APA.

Figure 8:
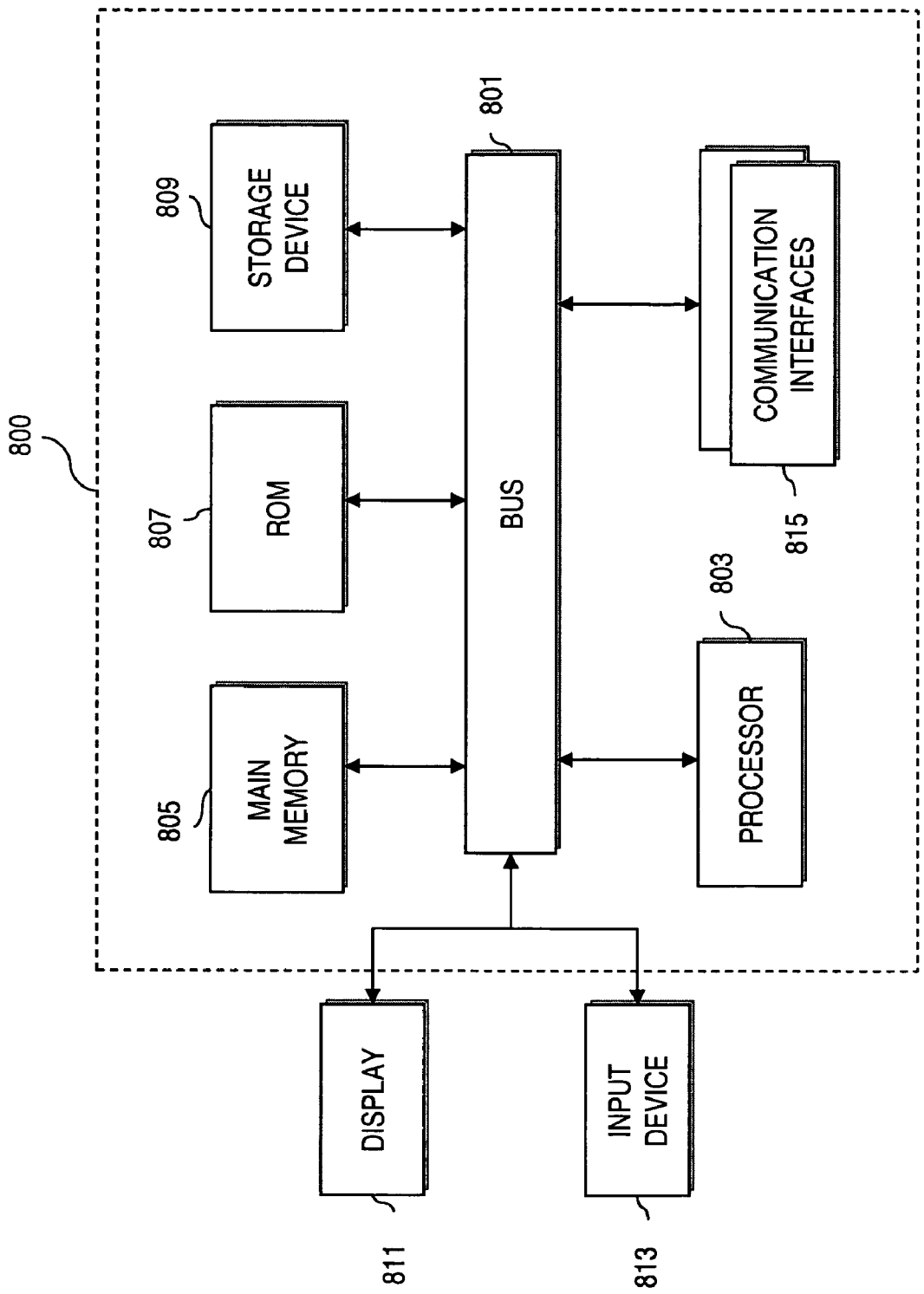
FIG. 8 is a diagram of hardware that can be used to implement an embodiment of the present invention.

FIG. 8 illustrates exemplary hardware upon which an embodiment according to the present invention can be implemented. A computing system 800 includes a bus 801 or other communication mechanism for communicating information and a processor 803 coupled to the bus 801 for processing information. The computing system 800 also includes main memory 805, such as a random access memory (RAM) or other dynamic storage device, coupled to the bus 801 for storing information and instructions to be executed by the processor 803. Main memory 805 can also be used for storing temporary variables or other intermediate information during execution of instructions by the processor 803. The computing system 800 may further include a read only memory (ROM) 807 or other static storage device coupled to the bus 801 for storing static information and instructions for the processor 803. A storage device 809, such as a magnetic disk or optical disk, is coupled to the bus 801 for persistently storing information and instructions.

The computing system 800 may be coupled via the bus 801 to a display 811, such as a liquid crystal display, or active matrix display, for displaying information to a user. An input device 813, such as a keyboard including alphanumeric and other keys, may be coupled to the bus 801 for communicating information and command selections to the processor 803. The input device 813 can include a cursor control, such as a mouse, a trackball, or cursor direction keys, for communicating direction information and command selections to the processor 803 and for controlling cursor movement on the display 811.

According to one embodiment of the invention, the process of FIG. 4 can be provided by the computing system 800 in response to the processor 803 executing an arrangement of instructions contained in main memory 805. Such instructions can be read into main memory 805 from another computer-readable medium, such as the storage device 809. Execution of the arrangement of instructions contained in main memory 805 causes the processor 803 to perform the process steps described herein. One or more processors in a multi-processing arrangement may also be employed to execute the instructions contained in main memory 805. In alternative embodiments, hard-wired circuitry may be used in place of or in combination with software instructions to implement the embodiment of the present invention. In another example, reconfigurable hardware such as Field Programmable Gate Arrays (FPGAs) can be used, in which the functionality and connection topology of its logic gates are customizable at run-time, typically by programming memory look up tables. Thus, embodiments of the present invention are not limited to any specific combination of hardware circuitry and software.

The computing system 800 also includes at least one communication interface 815 coupled to bus 801. The communication interface 815 provides a two-way data communication coupling to a network link (not shown). The communication interface 815 sends and receives electrical, electromagnetic, or optical signals that carry digital data streams representing various types of information. Further, the communication interface 815 can include peripheral interface devices, such as a Universal Serial Bus (USB) interface, a PCMCIA (Personal Computer Memory Card International Association) interface, etc.

The processor 803 may execute code that is being received over the communication interface 815 and/or store the code in the storage device 809, or other non-volatile storage for later execution. In this manner, the computing system 800 may obtain application code in the form of a carrier wave.

The term "computer-readable medium" as used herein refers to any medium that participates in providing instructions to the processor 803 for execution. Such a medium may take many forms, including but not limited to non-volatile media, volatile media, and transmission media. Non-volatile media include, for example, optical or magnetic disks, such as the storage device 809. Volatile media include dynamic memory, such as main memory 805. Transmission media include coaxial cables, copper wire and fiber optics, including the wires that comprise the bus 801. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on a storage device either before or after execution by processor.

While the present invention has been described in connection with a number of embodiments and implementations, the present invention is not so limited but covers various obvious modifications and equivalent arrangements, which fall within the purview of the appended claims.

What is claimed is:

1. A method for controlling transmission power in a wireless terminal, the method comprising:
   determining a plurality of parameter values for power adjustment of a radio frequency (RF) amplifier within the wireless terminal, the parameter values specifying operating conditions of the wireless terminal, wherein the operating conditions include transmit frequency, voltage of the battery, temperature of the wireless terminal, or channel information; and
   computing a power adjustment factor based on the parameter values, wherein the power adjustment factor is used to adjust limiting power of the RF amplifier.

2. A method according to claim 1, wherein the wireless terminal is powered by a battery, and the power adjustment factor is computed to minimize current drain of the battery.

3. A method according to claim 1, wherein the power adjustment factor ($P_{APA}$) is computed according to:

$$P_{APA(dB)} = A_n*\text{Freq}^n + A_{n-1}*\text{Freq}^{n-1} + \ldots + A*\text{Freq} + B_n*V_{batt}^n + B_{n-1}*V_{batt}^{n-1} + \ldots + B*V_{batt} + C_n*T^n + C_{n-1}*T^{n-1} + \ldots + C*T + \text{Channel}*D + E$$

wherein Freq is the transmit frequency, $V_{batt}$ is the battery voltage, T is an internal temperature of the wireless terminal, Channel is the channel information, $A_n \ldots A$ are frequency coefficients, $B_n \ldots B$ are battery voltage coefficients, $C_n \ldots C$ are temperature coefficients, D is a channel configuration coefficient, E is a constant, and n is an integer.

4. A method according to claim 1, wherein the wireless terminal operates in a cellular system.

5. A method according to claim 4, wherein the cellular system utilizes Code Division Multiple Access (CDMA) or Wideband CDMA (WCDMA) for serving the wireless terminal.

6. A method according to claim 4, wherein the wireless terminal is a cellular phone.

7. A method according to claim 1, further comprising:
   modifying the transmission power with an adjustment factor for temperature, wherein the temperature adjustment factor provides linear correction that is frequency dependent.

8. A computer-readable medium bearing instructions for controlling transmission power in a wireless terminal, said instructions, being arranged, upon execution, to cause one or more processors to perform the method of claim 1.

9. An apparatus for controlling transmission power in a wireless terminal, the apparatus comprising:
   logic configured to determine a plurality of parameter values for power adjustment of a radio frequency (RF) amplifier within the wireless terminal, the parameter values specifying operating conditions of the wireless terminal, the logic being further configured to compute a power adjustment factor based on the parameter values,
   wherein the operating conditions include transmit frequency, voltage of the battery, temperature of the wireless terminal, or channel information,
   wherein the power adjustment factor is used to adjust limiting power of the RF amplifier.

10. An apparatus according to claim 9, wherein the wireless terminal is powered by a battery, and the power adjustment factor is computed to minimize current drain of the battery.

11. An apparatus according to claim 9, wherein the power adjustment factor ($P_{APA}$) is computed according to:

$$P_{APA(dB)} = A_n*\text{Freq}^n + A_{n-1}*\text{Freq}^{n-1} + \ldots + A*\text{Freq} + B_n*V_{batt}^n + B_{n-1}*V_{batt}^{n-1} + \ldots + B*V_{batt} + C_n*T^n + C_{n-1}*T^{n-1} + \ldots + C*T + \text{Channel}*D + E$$

wherein Freq is the transmit frequency, $V_{batt}$ is the battery voltage, T is an internal temperature of the wireless terminal, Channel is the channel information, $A_n \ldots A$ are frequency coefficients, $B_n \ldots B$ are battery voltage coefficients, $C_n \ldots C$ are temperature coefficients, D is a channel configuration coefficient, E is a constant, and n is an integer.

12. An apparatus according to claim 9, wherein the wireless terminal operates in a cellular system.

13. An apparatus according to claim 12, wherein the cellular system utilizes Code Division Multiple Access (CDMA) or Wideband CDMA (WCDMA) for serving the wireless terminal.

14. An apparatus according to claim 12, wherein the wireless terminal is a cellular phone.

15. An apparatus according to claim 9, wherein the logic is further configured to determine an adjustment factor for temperature, wherein the temperature adjustment factor provides linear correction of output power of the RF amplifier according to frequency.

16. An apparatus for communicating in a radio communication system, the apparatus comprising:
a radio frequency (RF) amplifier configured to amplify a signal for transmission over the radio communication system; and
logic configured to determine a plurality of parameter values for power adjustment of the RF amplifier, the parameter value specifying operating conditions, wherein the operating conditions include transmit frequency, voltage of the battery, temperature of the wireless terminal, or channel information, the logic being further configured to compute a power adjustment factor based on the parameter values, wherein the power adjustment factor is used to adjust input power of the RF amplifier.

17. An apparatus according to claim 16, further comprising:
a battery configured to supply power to the apparatus, wherein the power adjustment factor is computed to minimize current drain of the battery.

18. An apparatus according to claim 16, wherein the power adjustment factor ($P_{APA}$) is computed according to:

$$P_{APA(dB)} = A_n * \text{Freq}^n + A_{n-1} * \text{Freq}^{n-1} + \ldots + A * \text{Freq} + B_n * V_{batt}^n + B_{n-1} * V_{batt}^{n-1} + \ldots + B * V_{batt} + C_n * T^n + C_{n-1} * T^{n-1} + \ldots + C * T + \text{Channel} * D + E$$

wherein Freq is the transmit frequency, $V_{batt}$ is the battery voltage, T is an internal temperature of the wireless terminal, Channel is the channel information, $A_n \ldots A$ are frequency coefficients, $B_n \ldots B$ are battery voltage coefficients, $C_n \ldots C$ are temperature coefficients, D is a channel configuration coefficient, E is a constant, and n is an integer.

19. An apparatus according to claim 16, wherein the radio communication system is a cellular system.

20. An apparatus according to claim 19, wherein the cellular system utilizes Code Division Multiple Access (CDMA) or Wideband CDMA (WCDMA) for processing the signal.

21. An apparatus according to claim 19, wherein the apparatus is a cellular phone.

22. An apparatus according to claim 16, wherein the logic is further configured to determine an adjustment factor for temperature, wherein the temperature adjustment factor provides linear correction of output power of the RF amplifier according to frequency.

23. An apparatus for controlling transmission power, the apparatus comprising:
means for determining a plurality of parameter values for power adjustment of a radio frequency (RF) amplifier within a wireless terminal, the parameter values specifying operating conditions of the wireless terminal, wherein the operating conditions include transmit frequency, voltage of the battery, temperature of the wireless terminal, or channel information; and
means for computing a power adjustment factor based on the parameter values, wherein the power adjustment factor is used to adjust limiting power of the RF amplifier.

24. An apparatus according to claim 23, wherein the wireless terminal is powered by a battery, and the power adjustment factor is computed to minimize current drain of the battery.

25. An apparatus according to claim 23, wherein the power adjustment factor ($P_{APA}$) is computed according to:

$$P_{APA(dB)} = A_n * \text{Freq}^n + A_{n-1} * \text{Freq}^{n-1} + \ldots + A * \text{Freq} + B_n * V_{batt}^n + B_{n-1} * V_{batt}^{n-1} + \ldots + B * V_{batt} + C_n * T^n + C_{n-1} * T^{n-1} + \ldots + C * T + \text{Channel} * D + E$$

wherein Freq is the transmit frequency, $V_{batt}$ is the battery voltage, T is an internal temperature of the wireless terminal, Channel is the channel information, $A_n \ldots A$ are frequency coefficients, $B_n \ldots B$ are battery voltage coefficients, $C_n \ldots C$ are temperature coefficients, D is a channel configuration coefficient, E is a constant, and n is an integer.

26. An apparatus according to claim 23, wherein the wireless terminal operates in a cellular system.

27. An apparatus according to claim 26, wherein the cellular system utilizes Code Division Multiple Access (CDMA) or Wideband CDMA (WCDMA) for serving the wireless terminal.

28. An apparatus according to claim 26, wherein the wireless terminal is a cellular phone.

29. An apparatus according to claim 23, further comprising:
means for determining an adjustment factor for temperature, wherein the temperature adjustment factor provides linear correction of the transmission power according to frequency.

30. A method for adjusting power of a transmitter power amplifier in a wireless terminal, the method comprising:
collecting sensor information on operating conditions of the wireless terminal;
determining, based on the collected sensor information and stored parameter values, an adjustment factor for modifying a tuned power of a radio frequency (RF) amplifier within the wireless terminal, the adjustment factor modifying limiting power of the transmitter power amplifier for the operating conditions,
wherein the sensor information includes temperature of the wireless terminal and voltage of the battery, and the parameter values include frequency, channel information, or coefficient values corresponding to the temperature, the voltage of the battery, the frequency or the channel information; and
generating output power by applying the determined adjustment factor to the tuned power.

31. A method according to claim 30, wherein the wireless terminal is powered by a battery, and the adjustment factor minimizes current drain of the battery.

32. A computer-readable medium bearing instructions for adjusting power of a transmitter power amplifier in a wireless terminal, said instructions, being arranged, upon execution, to cause one or more processors to perform the method of claim 30.

33. An apparatus for operating in a wireless network, the method comprising:
means for collecting sensor information on operating conditions;
means for determining, based on the collected sensor information and stored parameter values, an adjustment factor for modifying a tuned power of a radio frequency (RF) amplifier, the adjustment factor modifying limiting power of the RF amplifier for the operating conditions;
means for generating output power by applying the determined adjustment factor to the tuned power; and
a power source configured to power the RF power amplifier, wherein the adjustment factor minimizes consumption of the power source.

34. An apparatus according to claim 33, wherein the sensor information includes temperature of the apparatus and voltage of the power source, and the parameter values include frequency, channel information, and coefficient values corresponding to the temperature, the voltage of the power source, the frequency and the channel information.

* * * * *